US010024579B1

(12) United States Patent
Govar et al.

(10) Patent No.: US 10,024,579 B1
(45) Date of Patent: Jul. 17, 2018

(54) SOLAR PANEL DEPLOYMENT SYSTEM

(75) Inventors: Clint Justin Govar, Fredericksburg, VA (US); Evan Thomas Rule, Silver Spring, MD (US); Eric Bennet Shields, Germantown, MD (US); Anthony C. Suggs, Silver Spring, MD (US); Richard Patrick Hardy, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 1051 days.

(21) Appl. No.: 13/017,265

(22) Filed: Jan. 31, 2011

Related U.S. Application Data

(60) Provisional application No. 61/300,383, filed on Feb. 1, 2010.

(51) Int. Cl.
*F24J 2/46* (2006.01)
*F24J 2/36* (2006.01)
*F24J 2/38* (2014.01)

(52) U.S. Cl.
CPC ...................... *F24J 2/46* (2013.01)

(58) Field of Classification Search
USPC ......... 136/245, 246, 252; 126/627, 624, 711
See application file for complete search history.

(56) References Cited

U.S. PATENT DOCUMENTS

| 2,405,877 | A | * | 8/1946 | Delano | ................. | C02F 1/14 |
| | | | | | | 202/234 |
| 3,868,945 | A | * | 3/1975 | Konopka | .............. | F24J 2/242 |
| | | | | | | 126/563 |

(Continued)

FOREIGN PATENT DOCUMENTS

| DE | G 88 11 389.2 U1 | 12/1988 |
| EP | 0323335 A2 | 7/1989 |

(Continued)

OTHER PUBLICATIONS

"Eco Tech: Solar-Powerd GREENS Provides Renewable Energy to Marines on Battlefield," Dec. 12, 2009, Ecofriend, http://www.ecofriend.org/entry/eco-tech-solar-powered-greens-provides-renewable-energy-to-marines-on-battlefield/, accessed online Jan. 19, 2010.
"Ground Renewable Expeditionary ENergy System (GREENS)," ONR fact sheet, ONR Program Code 33, Nov. 2009, Office of Naval Research, accessed online.
La Toya T. Graddy, "Carderock Supports Navy and Marine Corps through Solar Power," Wavelengths Online, The official online publication of the Naval Surface Warfare Center, Carderock Division, Jan./Feb. 2010, p. 8, accessed online.
Darren Quick, "Marines Take GREENS Solar Power to the Front Lines," Dec. 9, 2009, http://www.gizmag.com/greens-solar-power-for-marines/13561/, accessed online Jan. 19, 2010.
"Media Release: Solar Energy Powers Marines on Battlefield—Office of Naval Research (ONR)," Dec. 7, 2009, http://www.onr.navy.mil/en/~/link.aspx?_id=685466B603734B9DB20FCFA8F3883E23&_z=z, accessed online Jan. 19, 2010.

(Continued)

*Primary Examiner* — Steven B McAllister
*Assistant Examiner* — Desmond C Peyton
(74) *Attorney, Agent, or Firm* — Howard Kaiser

(57) ABSTRACT

The present invention typically features integrative configurability for transportation/storage, and disintegrative configurability for operation. Two half-cases are coupled to obtain a case. A case is uncoupled to obtain two half-cases. Each half-case houses a solar panel (pivotably connected to the half-case) and a U-bar (pivotably connected to the solar panel). The solar panel is pivoted away from the half-case's interior to the angle-of-inclination desired for collecting solar energy. The U-bar is pivoted away from the solar panel's back to securely fit into one of plural parallel slots provided across the half-case's interior, the U-bar thereby holding the solar panel in place at the desired angle-of-inclination. The half-cases are laid flat individually to collect solar energy. A half-case is "compacted" by pivoting the U-bar proximate the solar panel's back and pivoting the solar panel proximate the half-case's interior. Two complementary half-cases, each compacted, are (re)attached to form a portable case.

13 Claims, 13 Drawing Sheets

(56) References Cited

U.S. PATENT DOCUMENTS

| | | | |
|---|---|---|---|
| 4,106,482 A | | 8/1978 | Savage et al. |
| 4,116,413 A | * | 9/1978 | Andersen ............. A47B 23/043 248/451 |
| 4,421,943 A | * | 12/1983 | Withjack ............... F24J 2/5264 126/569 |
| 4,452,234 A | * | 6/1984 | Withjack ....................... 126/627 |
| 4,552,125 A | * | 11/1985 | Borodulin et al. ........... 126/640 |
| 5,522,943 A | * | 6/1996 | Spencer ............... H01L 31/042 136/245 |
| 5,814,906 A | * | 9/1998 | Spencer et al. ............... 307/150 |
| 6,045,108 A | | 4/2000 | Cziraky |
| 6,201,181 B1 | * | 3/2001 | Azzam .................... H02S 40/38 126/600 |
| 6,212,712 B1 | * | 4/2001 | Topp ................................. 5/610 |
| 6,449,857 B1 | | 12/2002 | Lumley |
| 6,540,192 B2 | | 4/2003 | Ouellet |
| 6,737,573 B2 | * | 5/2004 | Yeh ........................ H02S 30/20 136/244 |
| 6,971,820 B2 | * | 12/2005 | Rossabi .................. B09C 1/005 405/128.15 |
| 6,974,904 B2 | * | 12/2005 | Azzam et al. ................ 136/244 |
| 7,513,250 B2 | | 4/2009 | Head et al. |
| 7,850,513 B1 | * | 12/2010 | Parker ................. F04D 25/0606 136/245 |
| 8,046,961 B1 | | 11/2011 | Cutting et al. |
| 8,432,124 B2 | | 4/2013 | Foster |
| 8,479,459 B2 | | 7/2013 | Tucker |
| 8,492,645 B1 | | 7/2013 | Strahm |
| D697,864 S | | 1/2014 | McGrath |
| 8,650,812 B2 | | 2/2014 | Cusson |
| 8,720,125 B2 | | 5/2014 | Andretich |
| 2006/0012331 A1 | * | 1/2006 | Gillette, II .................... 320/107 |
| 2006/0273757 A1 | | 12/2006 | Naguib |
| 2008/0029153 A1 | * | 2/2008 | Margalit ........................ 136/252 |
| 2008/0283114 A1 | * | 11/2008 | Gray .................... G06F 1/1628 136/245 |
| 2009/0102415 A1 | * | 4/2009 | Muchow et al. ............. 320/101 |
| 2010/0229919 A1 | * | 9/2010 | Benatar .................... A45C 5/03 136/246 |
| 2011/0120450 A1 | | 5/2011 | Luo et al. |
| 2011/0193513 A1 | | 8/2011 | Wagnon et al. |
| 2011/0204843 A1 | | 8/2011 | Foster |
| 2011/0220176 A1 | * | 9/2011 | Halpern et al. ............... 136/246 |
| 2011/0290306 A1 | | 12/2011 | Roberts |
| 2011/0291607 A1 | * | 12/2011 | Rossi et al. ................... 320/101 |
| 2012/0006317 A1 | | 1/2012 | Sade |
| 2012/0006381 A1 | | 1/2012 | Sorgento |
| 2012/0090659 A1 | | 4/2012 | Muchow et al. |
| 2012/0227788 A1 | | 9/2012 | Lundahl et al. |
| 2012/0235477 A1 | | 9/2012 | Korman |
| 2012/0313569 A1 | | 12/2012 | Curran |
| 2013/0000632 A1 | | 1/2013 | Lundahl et al. |
| 2013/0032443 A1 | | 2/2013 | Soedomo |
| 2013/0081061 A1 | | 4/2013 | Snidow |
| 2013/0082637 A1 | | 4/2013 | Eaton et al. |
| 2013/0134921 A1 | | 5/2013 | Shen et al. |
| 2013/0187464 A1 | | 7/2013 | Smith et al. |
| 2013/0240015 A1 | | 9/2013 | Chaimovski et al. |
| 2013/0256072 A1 | | 10/2013 | Farhat |
| 2013/0285595 A1 | | 10/2013 | Eaton, Jr. |
| 2013/0298962 A1 | | 11/2013 | Sorgento |
| 2014/0216529 A1 | | 8/2014 | Tucker |

FOREIGN PATENT DOCUMENTS

| | | | | |
|---|---|---|---|---|
| FR | 2691290 A1 | * | 11/1993 | ............. H01M 2/10 |
| GB | 2158219 A | | 11/1985 | |
| JP | 57139251 A | * | 8/1982 | |
| JP | 01295468 A | * | 11/1989 | |

OTHER PUBLICATIONS

Department of the Navy's Energy Program for Security and Independence, Oct. 2010, U.S. Department of the Navy, DASN Energy Office, accessed online (28 pages).

"Solar Energy Powers Marines on Battlefield," Dec. 9, 2009, Solar Daily, accessed online Jan. 19, 2010.

Tina Casey, "U.S. Marines Go GREENS with Portable SOlar-in-a-Suitcase," Dec. 11, 2009, CleanTechnica, http://cleantechnica.com/2009/12/11/us-marines-go-greens-with-portable-solar-in-a-suitcase/#more-4183, accessed online Jan. 19, 2010.

Tina Casey, "U.S. Marines Go GREENS with Portable SOlar-in-a-Suitcase," Dec. 11, 2009, Scientific American, http://www.scientificamerican.com/article.cfm?id=us-marines-go-greens-with-portable-2009-12&print=true, accessed online Jan. 19, 2010.

U.S. Appl. No. 61/300,383, filed Feb. 1, 2010, entitled "Solar Panel Deployment System," joint inventors Clint Justin Govar, Evan Thomas Rule, Eric Bennet Shields, Anthony C. Suggs, and Richard Patrick Hardy.

"Future is Bright for ONR's Lightweight, Sun-Powered Generator," U.S. Department of the Navy, Office of Naval Research (ONR), Dec. 21, 2011, http://www.eurekalert.org/pub_releases/2011-12/oonr-fib122111.php, accessed online Dec. 23, 2013.

"Power Suitcase! The Portable Solar Power Solution," AUSOLAR Solar & Renewable Energy Systems, Burpengary, QLD 4505, Australia, http://www.ausolar.com/specials.htm, 2007, accessed online Dec. 24, 2013.

Solar Power Suitcase (SSC 60 to SSC 170), Product Sheet, AUSOLAR Solar & Renewable Energy Systems, Burpengary, QLD 4505, Australia, linked to at http://www.ausolar.com/specials (2007), accessed online Dec. 24, 2013.

ECO 120W Solar Panel Kit, $1,195.00, ships in 24 hours, http://www.eco-camper.com/component/virtuennart/details/23/1/solar-panels/index2.php?&pop=1&tmpl=component, accessed online Jan. 19, 2010.

Marc Perton, "SolarMAX 13 Watt Solar Panels Go Anywhere," Engadget, http://www.engadget.com/2005/07/01/solarmax-13-watt-solar-panels-go-anywhere/, accessed online Jan. 19, 2010.

Solar Portable Solution, GE-SPS-4W, GreenEver Technology Co., Ltd (GEPVS), Green Ever—Ever Green!, www.gepvs.com, www.greenevertech.com, 2008, http://www.gepvs.com/product.asp?prod=SPS-2, accessed online Jan. 19, 2010.

Solar Portable Solution, GE-SPS-4W, GreenEver Technology Co., Ltd (GEPVS), Green Ever—Ever Green!, www. gepvs.com, www.greenevertech.com, 2008, http://www.gepvs.com/product.asp?prod=SPS, accessed online Jan. 19, 2010.

Edgar A. Gunther, "Solar Charger and Solar Panel Roundup—Part 2—Charging up 2007 International CES," Mar. 18, 2007, Gunther Portfolio—Photovoltaics, Solar Energy, and Energy Policy, http://guntherportfolio.blogspot.com/2007/03/solar-charger-and-solar-panel-roundup_18.html, accessed online Jan. 19, 2010.

"This or That? GreenTech: Sola Unagi is a Solar Power Generator in a Briefcase Tip of the Day," Apr. 3, 2008, Green Daily, http://www.greendaily.com/2008/04/03/greentech-sola-unagi-is-a-solar-power-generator-in-a-briefcase/, accessed online.

"Sol Unagi: A Suitcase Full of Solar Power," The Tech Blog, YAHOO! Tech, Apr. 9, 2008, http://tech.yahoo.com/...post=16687&comment_start=&comment_count=&sendurl=http://tech.yahoo.com/blog/patterson/16687, accessed online Jan. 19, 2010.

"Solar Photovoltaic Transport and Deployment for Direct Drive Air and Water Cooling," Jan. 18, 2011, A SunDanzer White Paper, SunDanzer, Tucson, Arizona, accessed online.

FORGE (Power Surety and Fuel Savings at the Edge), 3-page brochure, 2013, ZeroBase Energy, LLC, 160 Vester Street Ferndale Michigan 48220, www.thezerobase.com, accessed online on Jan. 7, 2014.

Clint Justin Govar and Michele Anderson, "Future Naval Capability: Advanced Power Generation," 25 pages, presented at the 2009 Joint Service Power Expo (Energy for the Warfighter), National Defense Industrial Association (NDIA) Meeting, May 5-7, 2009, New Orleans, Louisiana.

\* cited by examiner

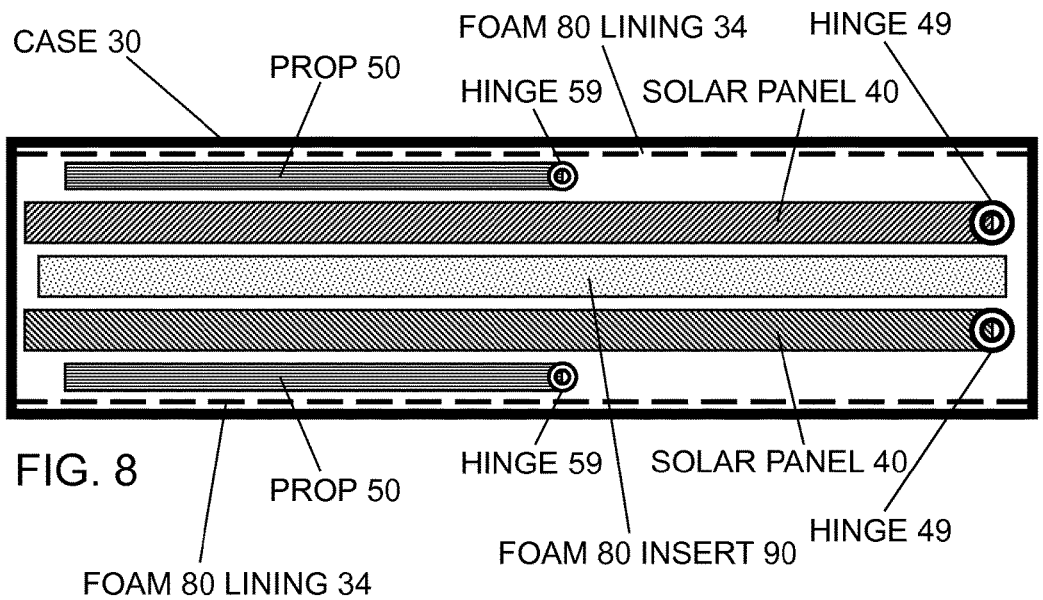
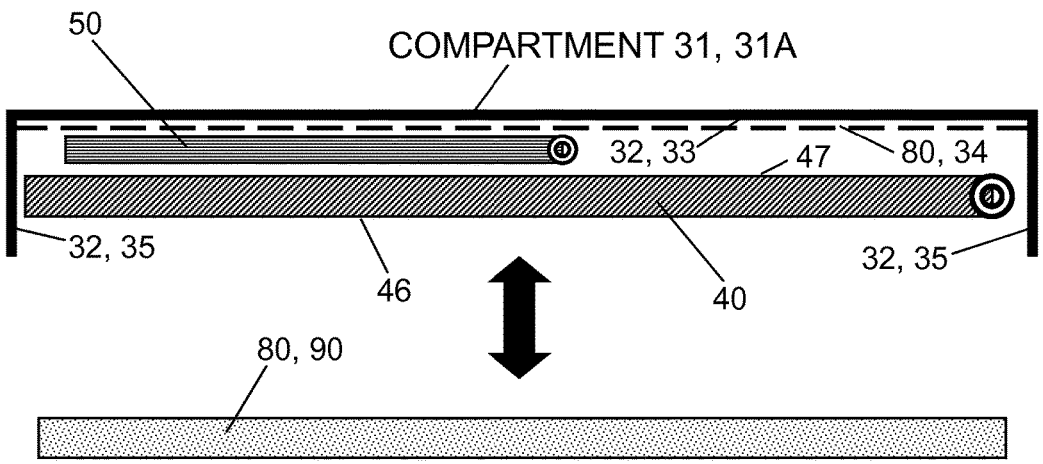
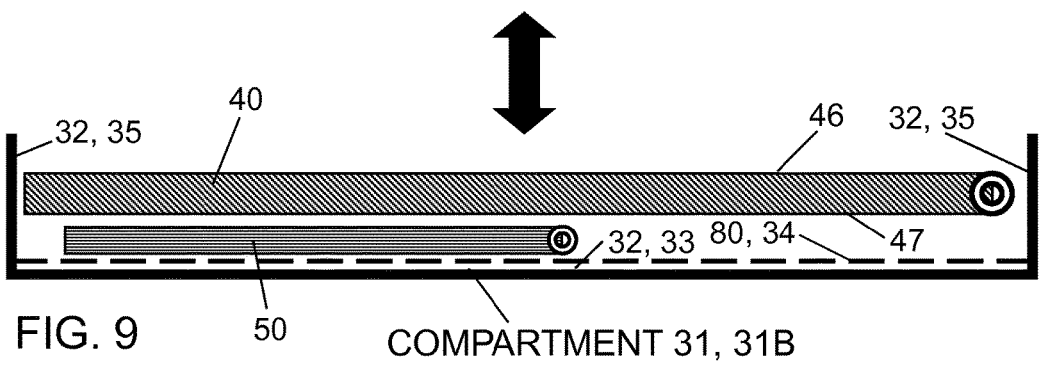

SOLAR PANEL DEPLOYMENT SYSTEM

CROSS-REFERENCE TO RELATED APPLICATIONS

This application claims the benefit of U.S. provisional application No. 61/300,383, filed 1 Feb. 2010, hereby incorporated herein by reference, entitled "Solar Panel Deployment System," joint inventors Clint Justin Govar, Evan Thomas Rule, Eric Bennet Shields, Anthony C. Suggs, and Richard Patrick Hardy.

BACKGROUND OF THE INVENTION

The present invention relates to solar energy, more particularly to methods and devices for collecting solar energy, such as involving use of solar panels for photovoltaically generating electricity.

The military has considered implementing renewable energy systems to mitigate risk and to reduce logistical fuel burdens on deployed troops. Solar power has been regarded as a prime candidate as a renewable energy source that is capable of being readily deployed and of significantly ameliorating demand for logistical fuel. A major obstacle to utilizing this free source of energy is the harsh military environment to which delicate (e.g., silicon-based) solar panels are to be exposed. The widespread use of solar panels in the field has been further impeded by practical difficulties attendant the transport (e.g., shipping and storage) and rapid deployment of solar collection systems. It is therefore desirable to devise a better methodology for transporting and rapidly deploying solar panels and for using same in harsh environments.

SUMMARY OF THE INVENTION

In view of the foregoing, it is an object of the present invention to provide an improved methodology for collecting solar energy "in the field."

The present invention is typically embodied as an apparatus for collecting solar energy. The inventive apparatus comprises a pair of containers, a pair of solar modules, and a pair of U-shaped support members. The containers each have an inside container surface and an outside container surface and plural alignments of at least two brackets mounted on the inside container surface. The solar modules are each pivotably connected to a container. The U-shaped support members are each pivotably connected to a solar module.

Each solar module is capable of a pivot-down module position or plural pivot-up module positions. The pivot-down module position is next to the corresponding container. Each pivot-up module position is distanced from the corresponding container. Each U-shaped support member is capable of a pivot-down member position or plural pivot-up member positions. The pivot-down member position is next to the corresponding solar module. Each pivot-up member position is distanced from the corresponding solar module. The containers are joinable to each other so as to enclose the solar modules in the pivot-down module position and the U-shaped support members in the pivot-down member position.

The containers are separable from each other for independent deployment of each solar module according to which the outside container surface is placed upon an area. Each solar module is deployable in either the pivot-down module position or a pivot-up module position. According to deployment of the solar module in the pivot-down module position, the U-shaped support member is in the pivot-down member position. According to deployment of the solar module in a pivot-up module position, the U-shaped support member is in a pivot-up member position and is slotted in an alignment of at least two brackets.

According to typical inventive practice, the present invention represents a rapidly deployable solar collection device that uniquely incorporates shipping and packaging into function. The present invention provides a solar energy collection device that is portable, rugged, and durable and that is configured for fast and easy deployment. The inventive device uniquely lends itself to being safely transported and rapidly deployed and then reliably operated in a harsh environment such as may characterize a military arena.

According to typical embodiments of the present invention, a case is sized for a pair of selected solar panels, and can be pre-outfitted with foam. Each case includes two case compartments (open case components). Each case compartment holds a solar panel, which deploys directly out of the case compartment, which serves as a base during deployment. Depending on factors including the size and weight of each case, the cases can be taken directly to the deployment site and opened, or the cases can be opened and separated into the two "halves" (not necessarily "half" and "half" in a dimensional sense), i.e., the two compartments, before being moved to the deployment site.

In accordance with some inventive embodiments, the solar panel is lifted up to the appropriate angle via a pair of hinging mechanisms that fasten the sides of the solar panel, in the vicinity of its front edge, directly to the sides of the case compartment enclosing the solar panel. Thus hinged by two pull-pins respectively engaged at its two corners, the solar panel is rotatable upward or downward. The solar panel unfolds out of the open "box" (case compartment) with its other end (i.e., the end opposite its hinged end) rotating/pivoting upward. In order to be set in place, the solar panel is supported by a U-shaped bar, which is made for example of a strong, lightweight material such as a metallic (e.g., aluminum) or composite material. The U-shaped bar is hingedly connected to the solar panel at its non-solar side, and can be locked in multiple discrete locations that correspond with the predetermined panel angles.

Other objects, advantages, and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein like numbers indicate same or similar parts or components, and wherein:

FIG. 1 through FIG. 9 show the case ("suitcase") in a closed condition (FIG. 1, FIG. 2, FIG. 3, FIG. 5, FIG. 6) or an opened condition (FIG. 4, FIG. 7), in accordance with various embodiments of the present invention. Each case includes two semi-case components, which can be joined (e.g., fastened together to form the case) and separated (e.g., unfastened to yield the separate semi-case components). FIGS. 1, 2, 5, 6, and 7 are photographic depictions.

FIG. 10 through FIG. 23 show deployment of the solar panel in accordance with various embodiments of the present invention. Each of FIGS. 10 through 23 shows at least one solar panel deployed at a predetermined fixed oblique angle with respect to the generally horizontal foundation on which the semi-case component rests. FIGS. 12A, 13, 14, 15, 16, 21, 22, and 23 are photographic depictions.

FIG. 23 additionally shows a solar panel that is not propped up at an oblique angle; that is, the solar panel as deployed remains approximately horizontal in accordance with the generally horizontal foundation.

FIGS. 16 through 18 particularly show some detail of the hinged connection of the solar panel to the semi-case component.

FIG. 19 particularly shows some detail of the hinged connection of the U-shaped prop to the semi-case component.

FIGS. 20 through 22 particularly show some detail of the slotting of the U-shaped prop in a groove/slot provided in foam lining the semi-case component's inner wall, and the locking of the transverse portion of the U-shaped prop via locking brackets mounted in the groove/slot.

DESCRIPTION OF EXEMPLARY EMBODIMENTS OF THE INVENTION

Figure 1:
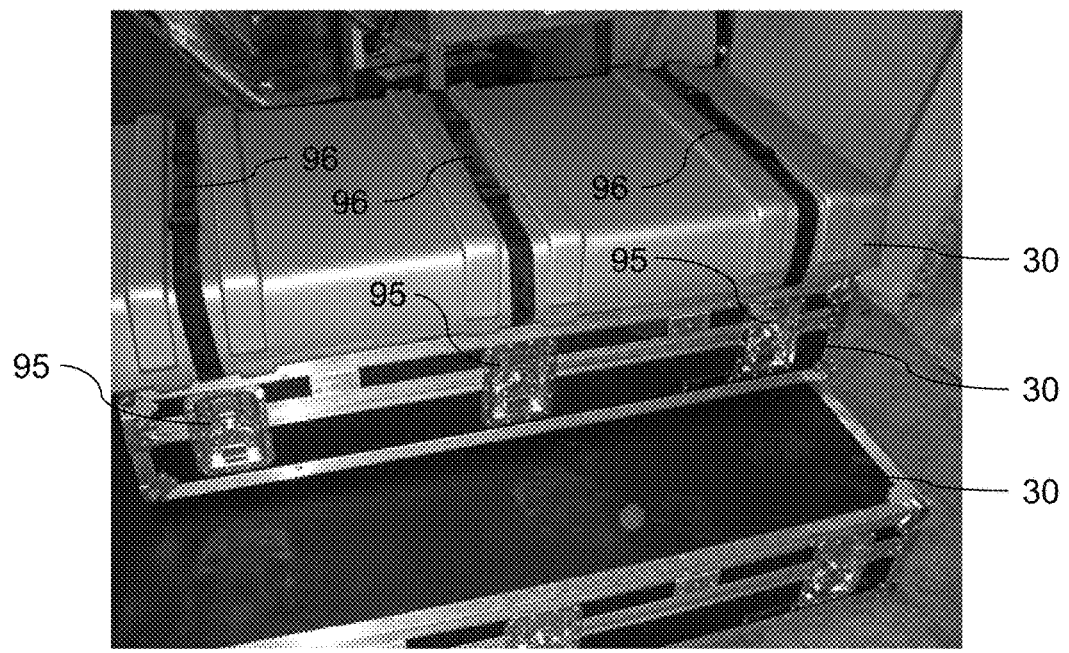

Referring now to the figures, the present invention's solar collection device, as typically embodied, includes a case 30, two solar panels 40, and two U-shaped bars 50. As shown in FIGS. 8 and 9, the case 30 includes and is separable into a pair of complementary main parts 31, viz., 31a and 31b, referred to herein as "compartments" or "open case components" or "semi-case components" or "half-case components." The open case components 31 are attachable to and detachable from each other and represent halves or semi-sections of the case 30. The terms "half" and "semi" as used herein to refer to the present invention's open case components are not intended to suggest that two joinable components necessarily are congruent or equally dimensioned, but rather to suggest that, according to typical inventive practice, they are major, comparable, and complementary components.

Particularly with reference to FIGS. 1 through 9, case 30 describes a rectangular parallelepiped and has length L, width W, and height H. Each open case component 31 describes a rectangular parallelepiped and has length L, width W, height h, and a lengthwise-widthwise edge 35. Open case compartment 31a has height ha and lengthwise-widthwise edge 35a. Open case compartment 31b has height hb and lengthwise-widthwise edge 35b. Case 30 and open case compartments 31a and 31b each have the same length L and the same width W. Height ha and height hb combine in a heightwise direction to equal height H. Case 30 is formed by the attachment of open case compartments 31a and 31b whereby lengthwise-widthwise edge 35a and lengthwise-widthwise edge 35b adjoin (e.g., border upon) each other. At least one fastener 95 is used to fasten open case compartments 31a and 31b to form case 30, and to unfasten open case compartments 31a and 31b so that they are separable.

Featured by typical inventive practice is the deployment of a solar panel 40 at a fixed angle using a U-shaped bar 50 in combination with a pivot 49 mounted to the solar panel 40 and brackets 38 mounted to the interior 32 of the case 30 (more specifically, to the bottom face 33 of the interior 32 of the case component 31). The U-shaped bars 50 are also referred to herein as "props" or "stands," because each U-shaped bar 50 serves the function of propping up or standing up the solar panel 40 to which it is hinged.

Figure 6:
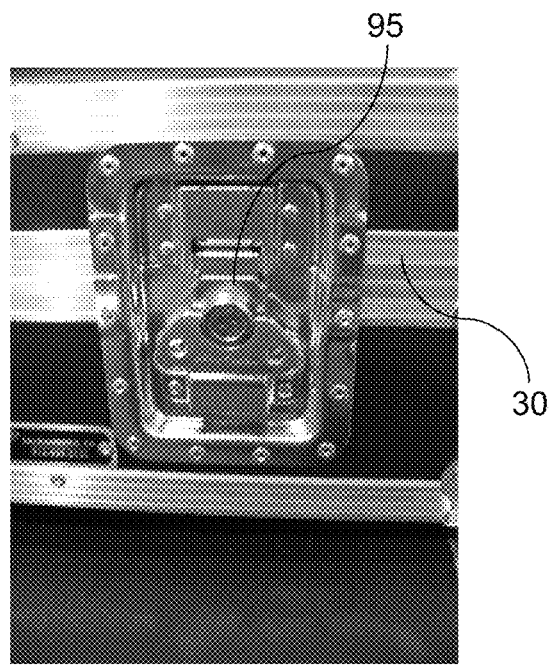
Figure 7:
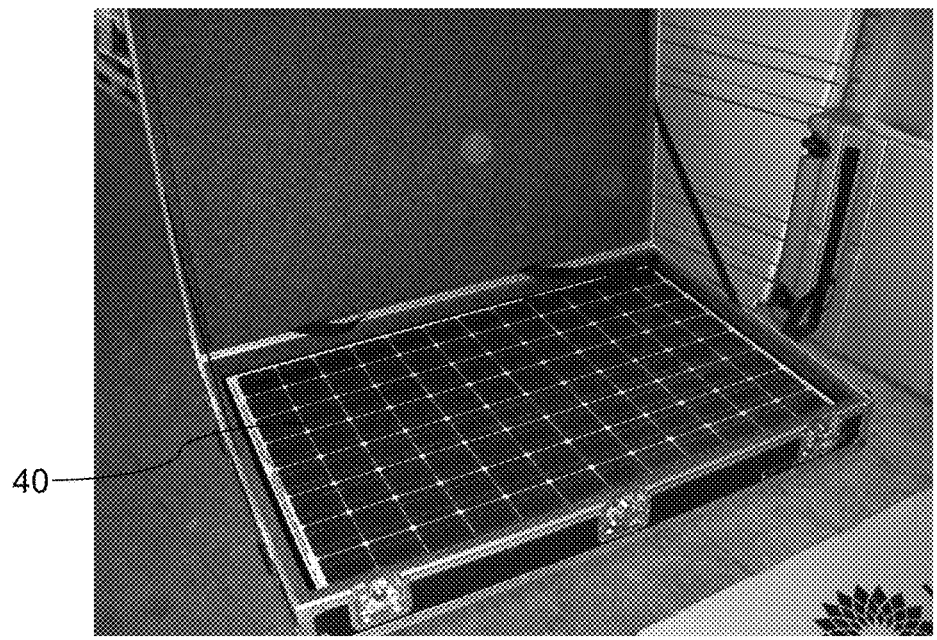
Figure 10:
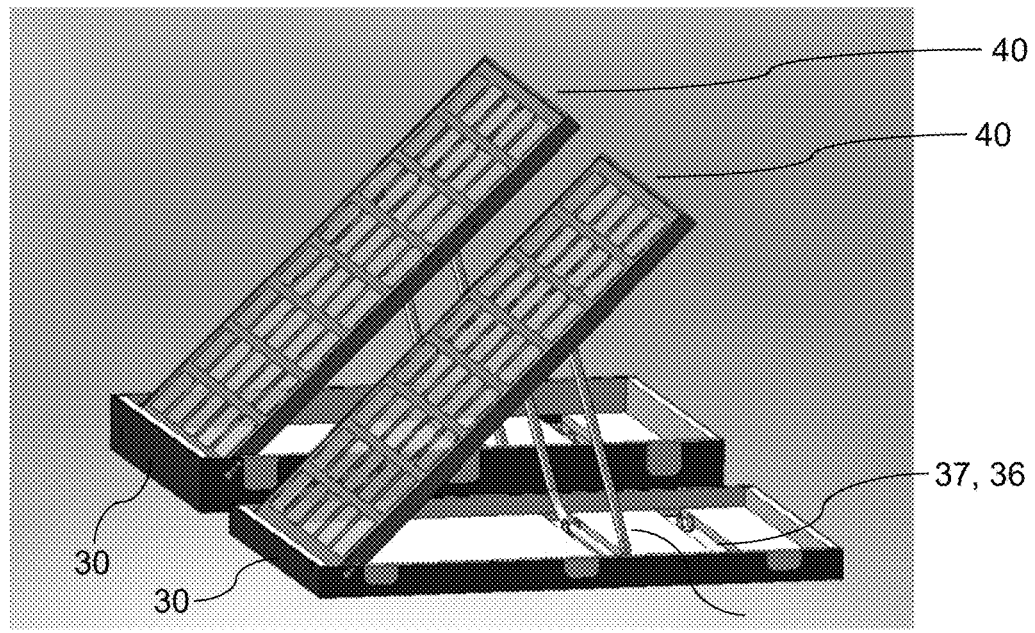
Figure 11:
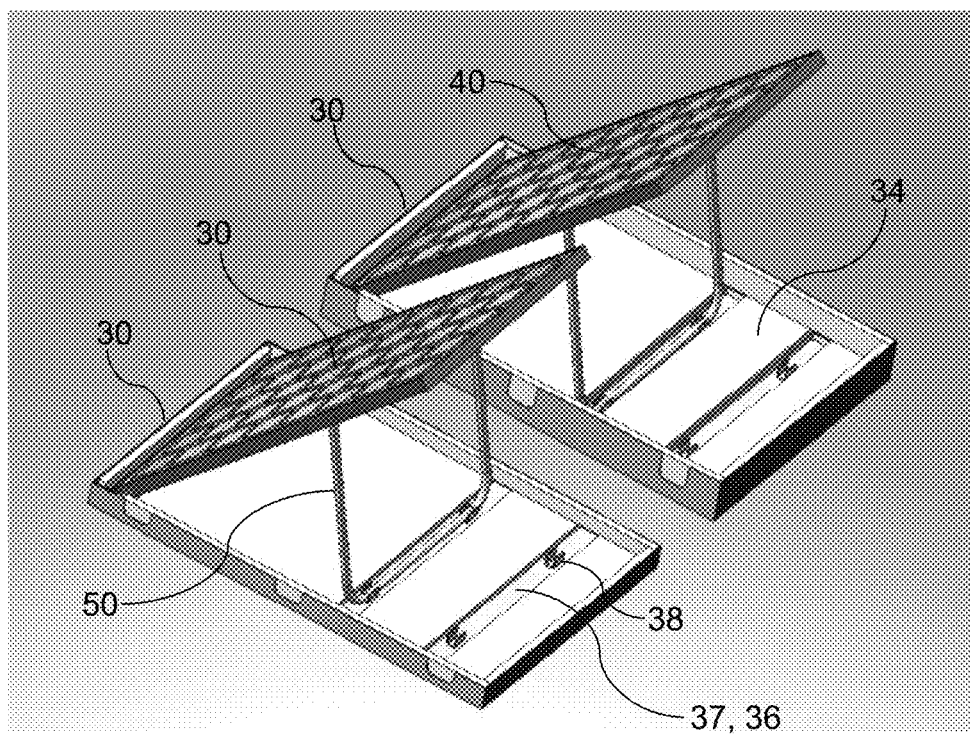
Figures 12, 12A:
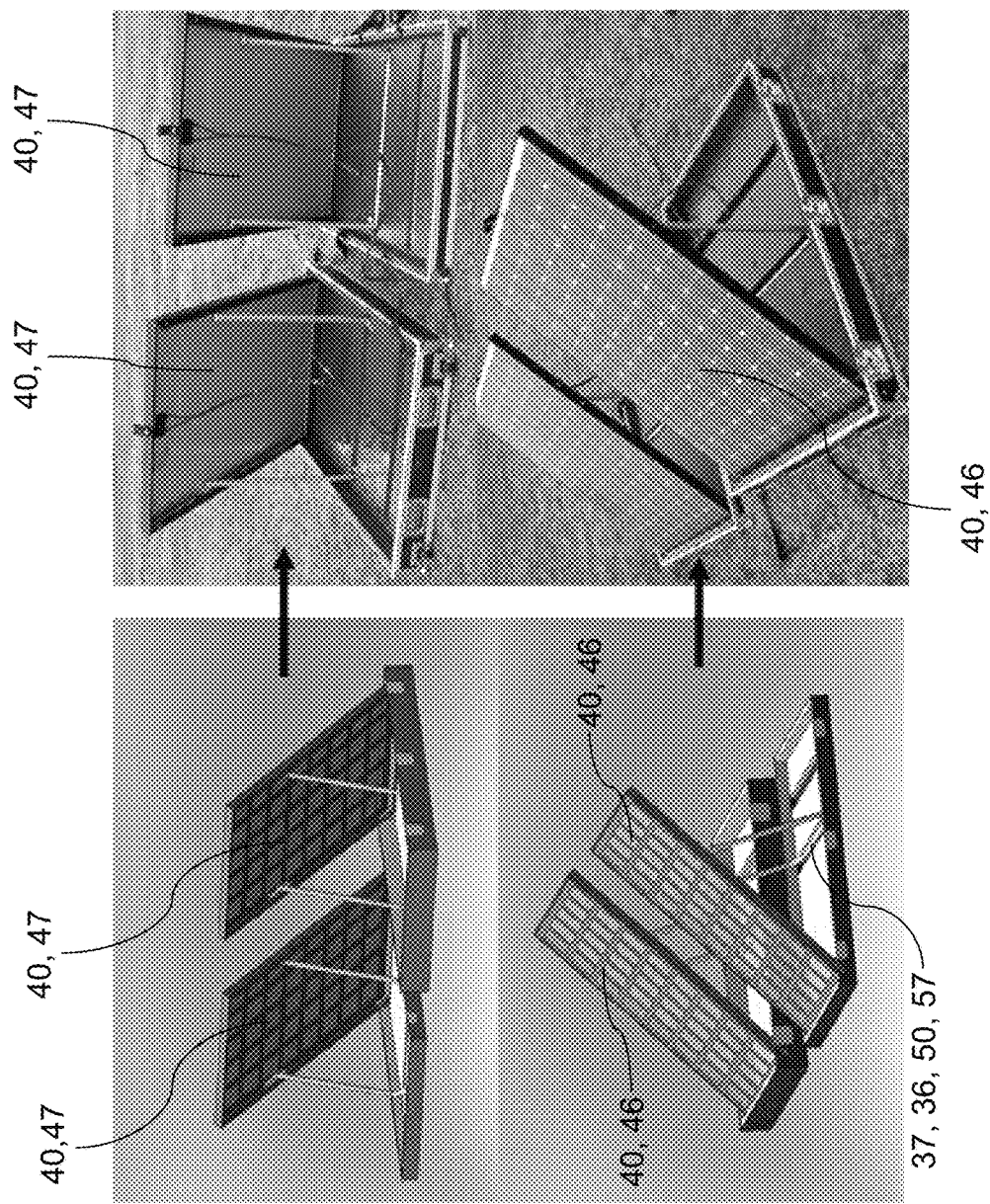
Figure 13:
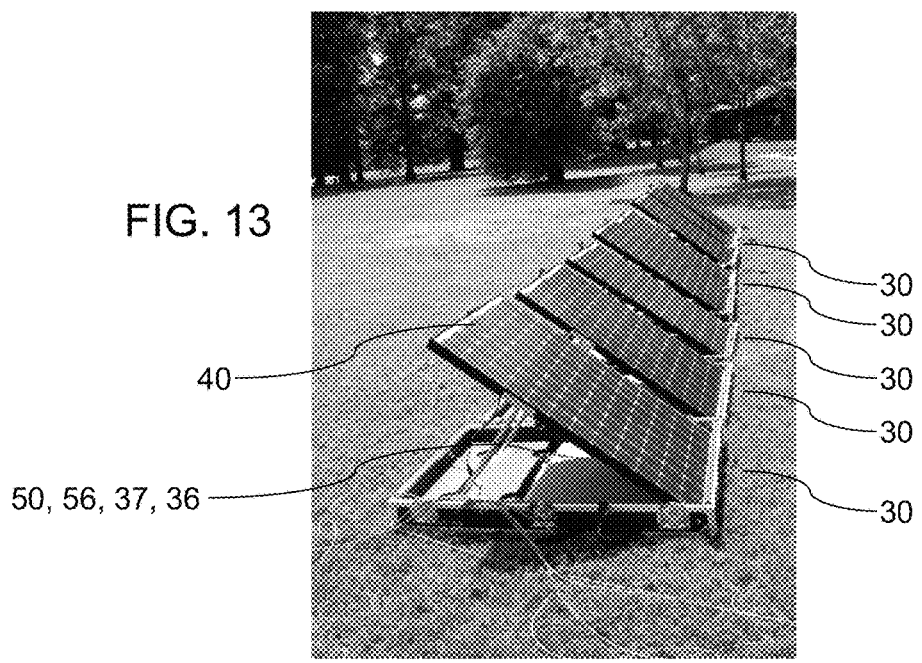
Figure 14:
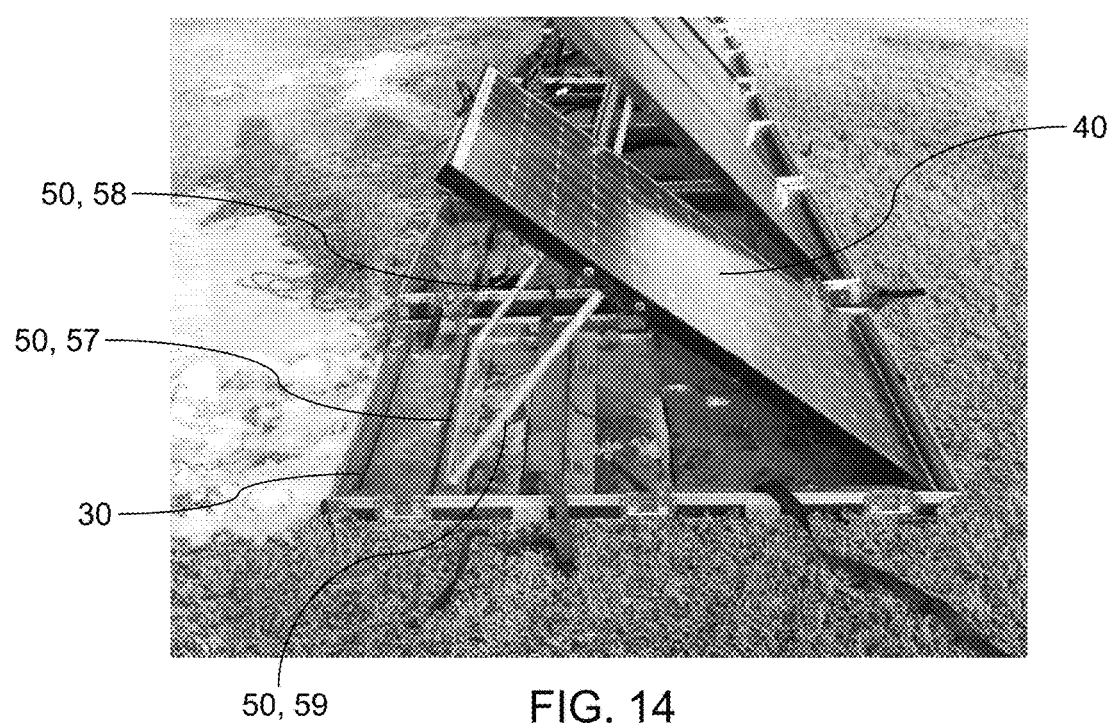
Figure 15:
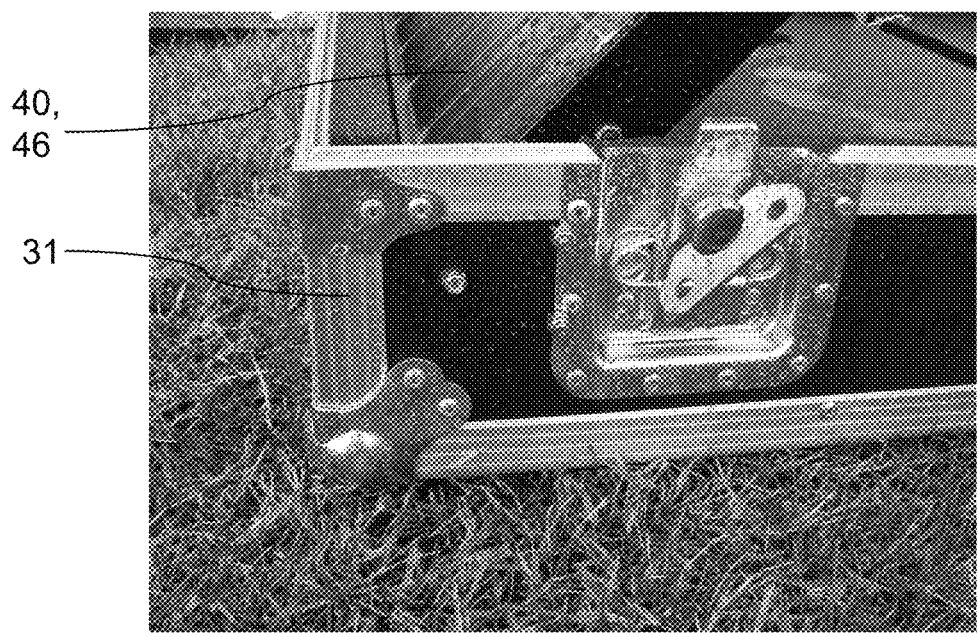
Figure 16:
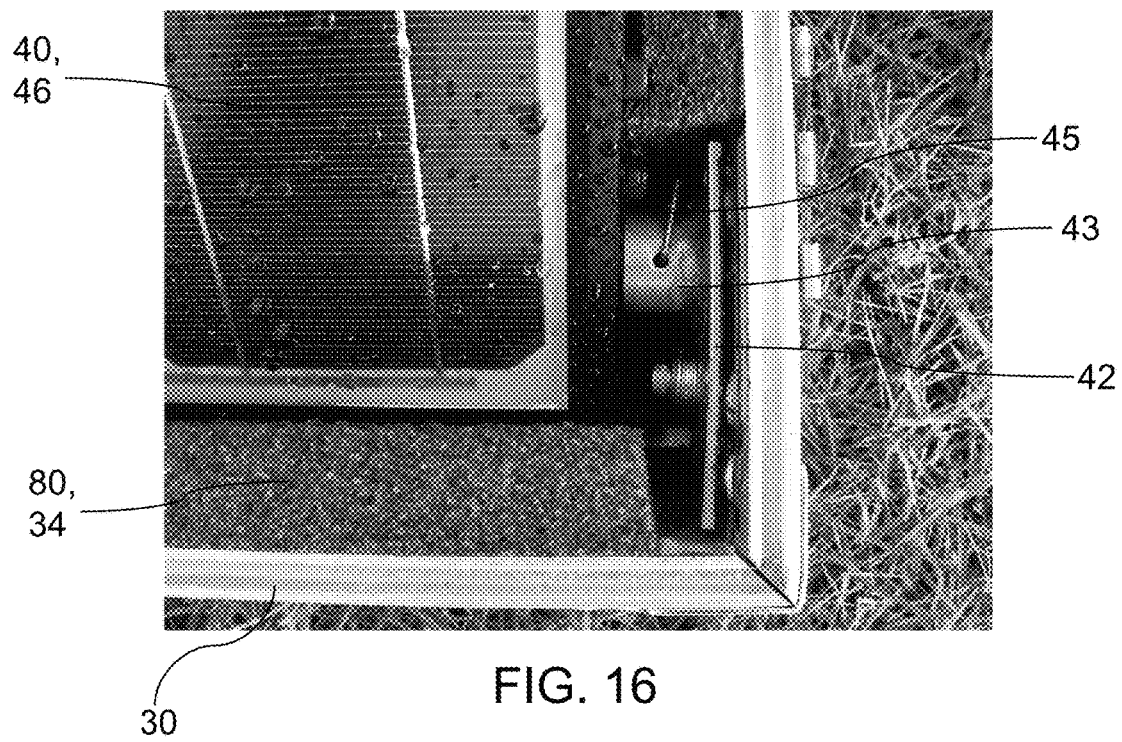

According to frequent inventive practice, the case 30 is at least partially lined with impact-absorbent material (e.g., foam) 80 to provide protection for the solar panels 40 during shipping and transit. Possible case types that can be used for inventive practice include rectangular clam-shell styles and hinged styles. A case 30 can be held together using mechanical fasteners 95 and/or straps 96 that wrap around both open case components, such as shown in FIG. 1 and FIG. 6. By way of example, in testing their invention the present inventors found that a particular hinged style case was more durable than a particular clam-shell style case, and was a better option for deployment and field operation.

Figure 17:
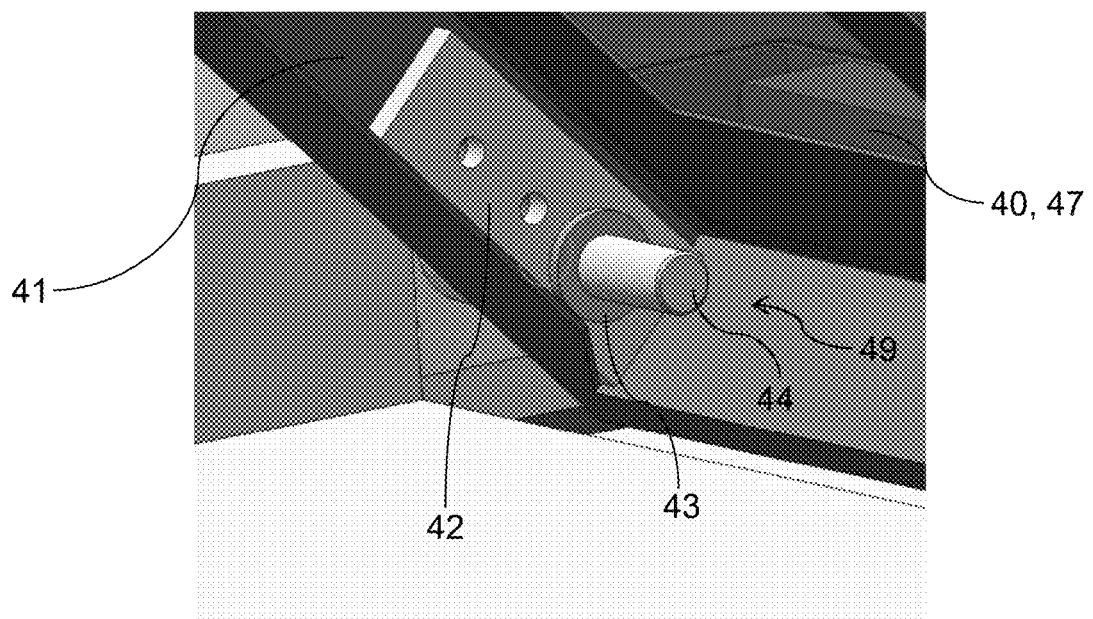
Figure 18:
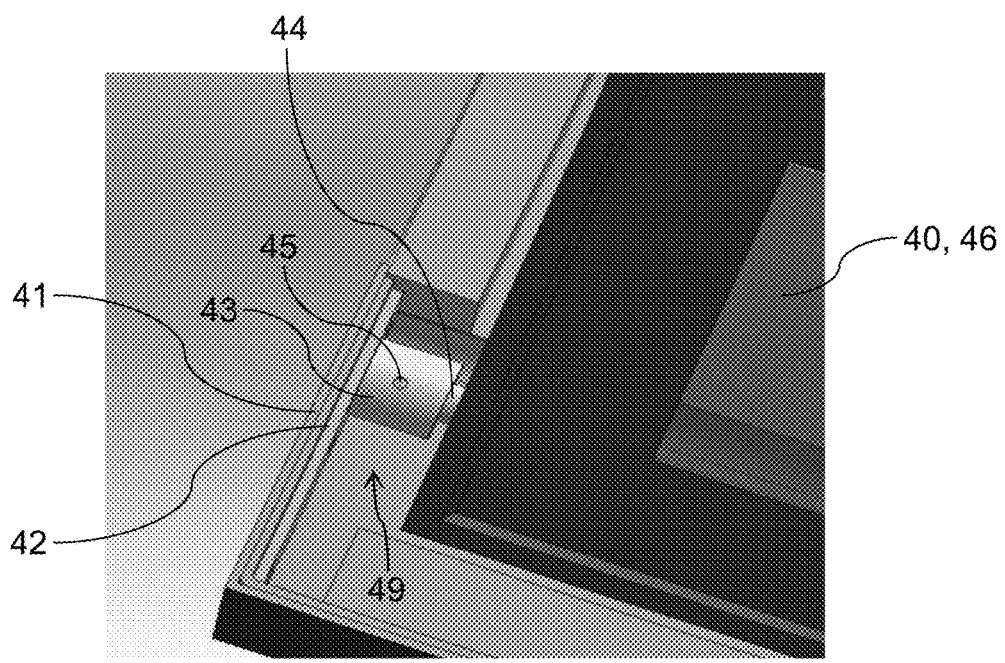

Each open case component 31 has a solar panel 40 rotatably connected thereto (e.g., hingedly attached via a pair of panel-pivoting mechanisms 49, typically at or near one end of the open case component 31). For instance, with reference to FIG. 17 and FIG. 18, the two axially aligned panel-pivoting mechanisms 49 are provided proximate the non-solar side 47 of a solar panel 40 at the two inside opposite side surfaces 41 of solar panel 40. Each inside opposite side surface 41 can have a panel-pivoting mechanism 49 including a metal (e.g., aluminum) plate 42 riveted thereto (e.g., for strengthening/reinforcement), a bored-out cylinder 43 welded to the plate 42, a hinge pin 44 provided through the cylinder bore 43, and a cotter pin 45 to prevent axial displacement of the hinge pin 44.

Figure 19:
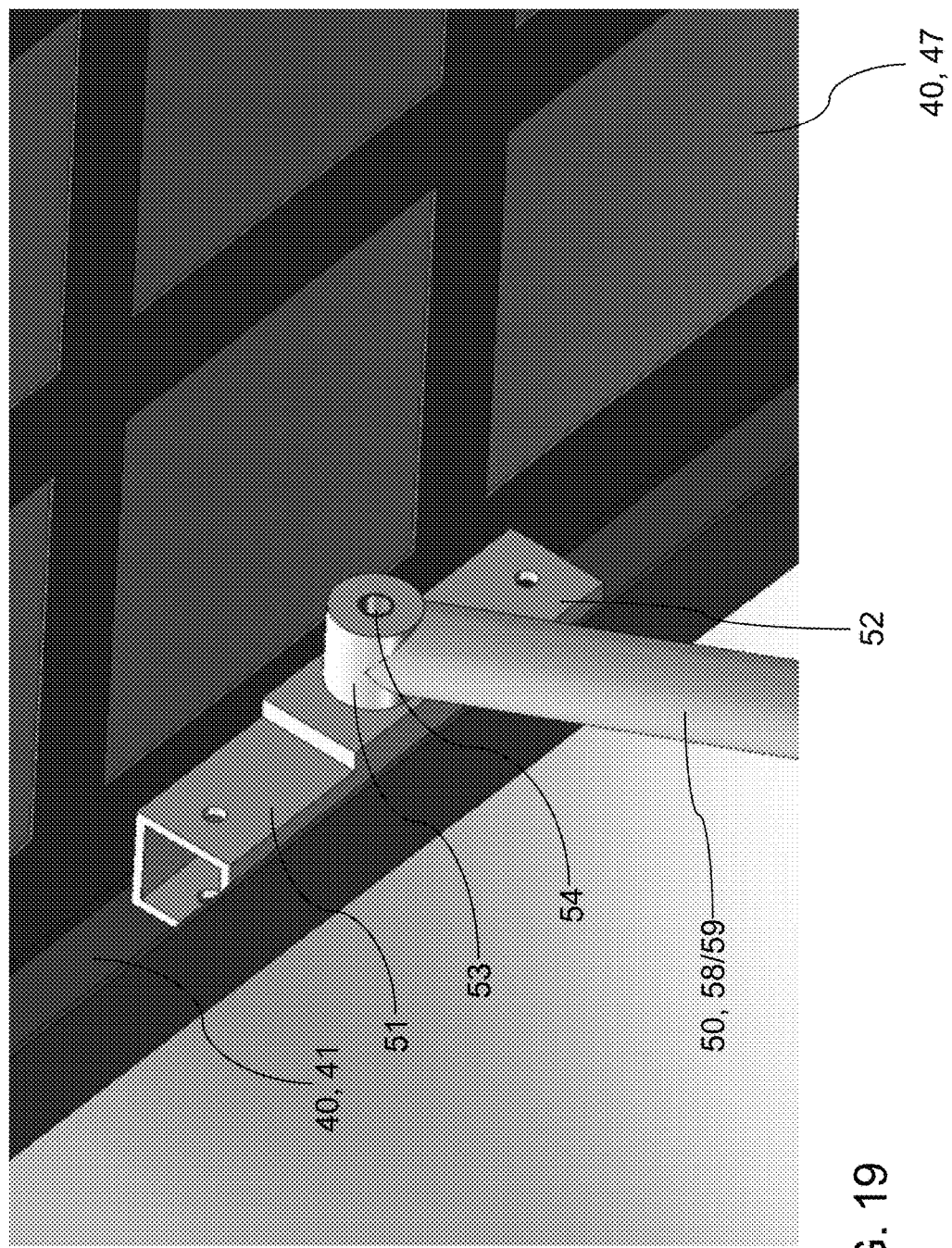

Each solar panel 40 has a U-shaped bar 50 rotatably connected thereto, e.g., hingedly attached via a pair of axially aligned bar-pivoting mechanisms 59, typically distanced from both ends of the solar panel 40, but closer to one end. Particularly referring to FIG. 19, each pivoting mechanism 59 for the U-shaped bar 50 can include, for instance, a threaded metal (e.g., aluminum) rectangular piece 51 and a metal plate 52 attached thereto (e.g., for strengthening/reinforcement). The U-shaped bar 50 can have attached at both ends a threaded cylindrically shaped member (like a bushing) 53. A bolt (e.g., a shoulder bolt) 54, can be threaded through the U-shaped bar 50's bushing-like member 43, the rectangular piece 51, and the plate 52 so that the U-shaped bar 50's bushing-like member 53 can pivot.

Figure 21:
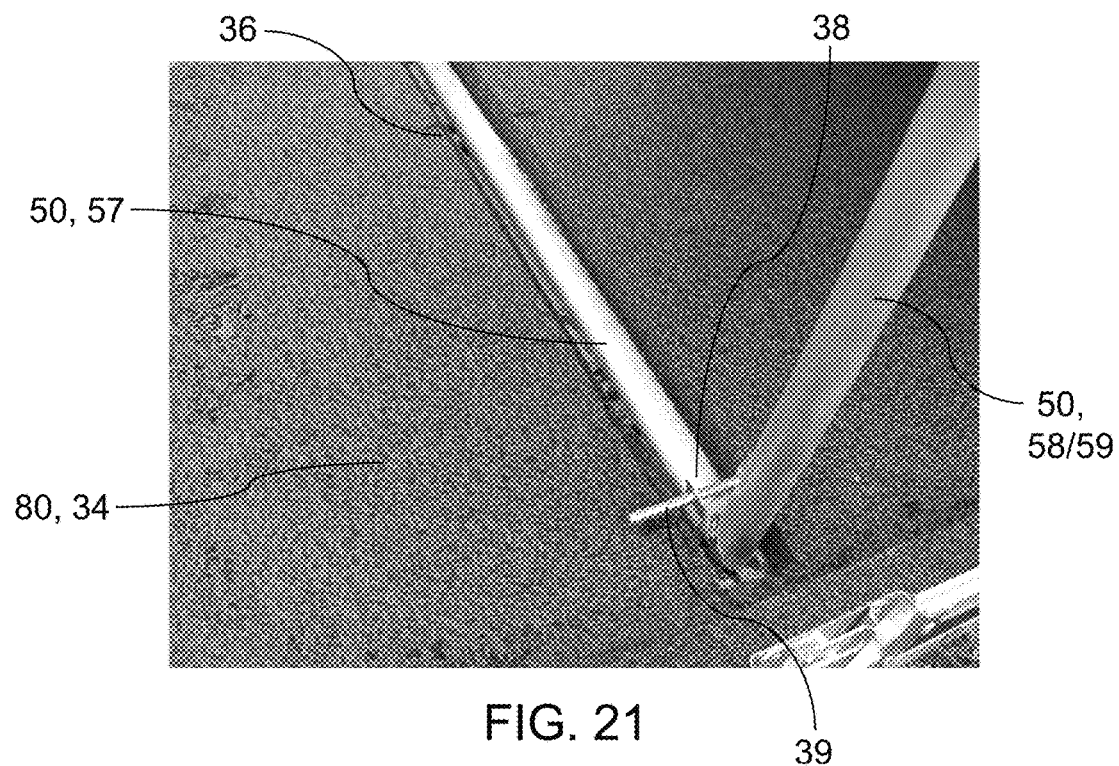

As shown in FIG. 9, each open case component 31 includes an inside surface 32, a bottom section 33, and a peripheral wall 35. Inside surface 32 is at least partially lined with an energy-absorbent (e.g., foam) material 80, and is provided at bottom section 33 with plural parallel grooves 36 (for instance, formed within or delineated by the energy-absorbent material 80 lining 34) in which locking brackets 38 are mounted, each locking bracket 38 having a locking pin 39, such as shown in FIG. 21. As shown in FIG. 21 and other figures, each groove 36 in the foam 80 lining 34 is provided with two aligned locking brackets 38 for keeping a U-shaped bar 50 in place. Each pair of brackets 38 in a given groove 36 defines a "slot" 37 in which fits the U-bottom portion 57 of the U-shaped bar 50.

Figure 3:
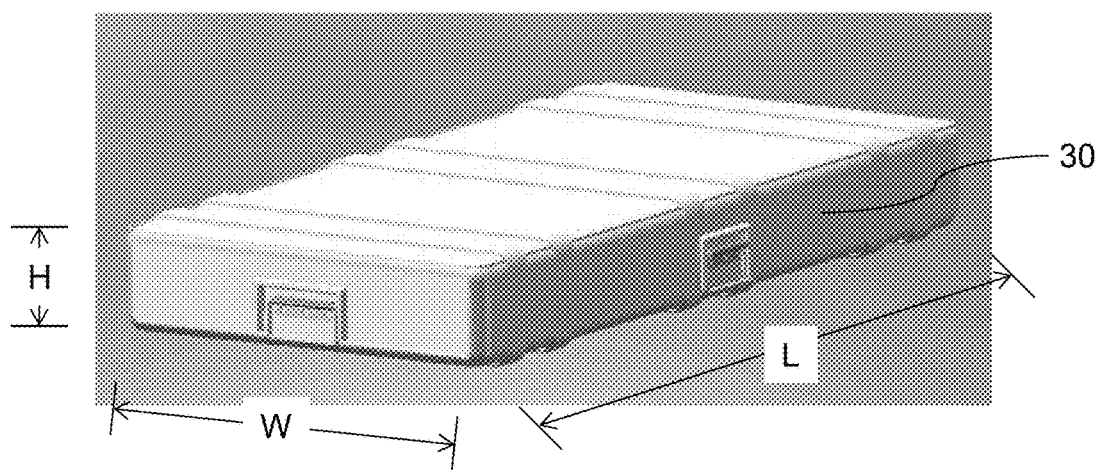
Figure 4:
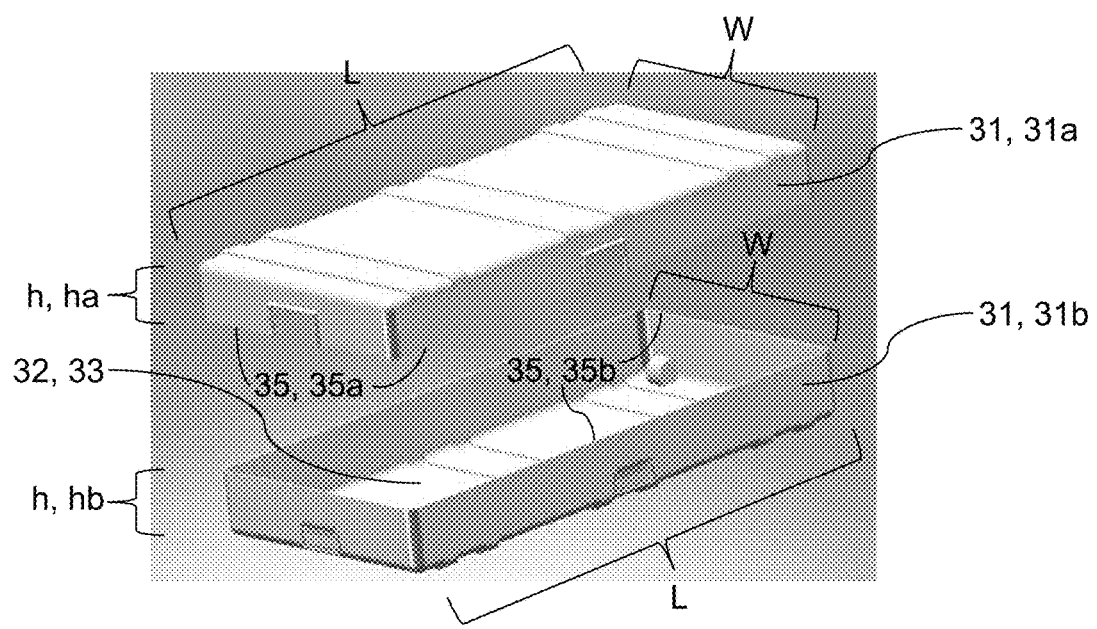

FIG. 8 and FIG. 9 diagrammatically illustrate coupled and uncoupled states, respectively, of case components 31a and 31b with respect to each other. FIG. 3 and FIG. 4 are similarly illustrative of coupled and uncoupled states. When the two open case components 31 are coupled (e.g., for transport purposes), the two solar panels 40, the two U-shaped bars 50, and the inside walls 32 of the case 30 are closely situated inside the case 30. A cross-sectional view of the contents of the closed case 30 may reveal, for instance, a kind of layered configuration. Two adjacent solar panels 40 have their respective solar collection surfaces 46 facing each other. Each solar panel 40 is hinged, via a panel-pivoting mechanism 49, with respect to the corresponding case component 31. Between each solar panel 40's non-collection (opposite) surface 47 and the nearer foam-lined case wall 32 is the U-shaped bar 50 that is hinged (via bar-pivoting mechanism 59) to that solar panel 40.

Some inventive embodiments enhance impact resistance by providing a buffering layer such as an energy-absorptive (e.g., foam) material 80 insert 90, depicted in FIG. 8 and FIG. 9. Foam insert 90 is placed between the respective solar collection surfaces 46 of the adjoining solar panels 40. Furthermore, the present inventors investigated the possibility of placing foam material 80 in the cavity delimited by the solar panel 40's non-collection face 47 (behind the solar panel 40's collection face 46) to enhance solar panel protection. However, due to the higher temperatures resulting from the insulating characteristics of the foam 80 backing, the solar panel 40 produced about 15% less power. Based on this data, it was determined that a backing of foam should not be used for a solar panel 40 while deployed.

When the two open case components 31 are uncoupled (e.g., decoupled for deployment purposes), the case 30 opens and separates into the two open case components 31. In association with each open case component 31, the solar panel 40 (which is hingedly attached via panel-pivoting mechanism 49 to the open case component 31) "pops out," so to speak; that is, the solar panel 40 is rotated or pivoted away from the inside wall 32 of the open case component 31. The base of each solar panel 40 is connected to a pair of rotating hinges 49, one hinge 49 on each side of the solar panel 40. The hinges 49 provide for adjustability of the angles of the solar panel 40, but prevent the solar panel 40 from being removed from the associated open case component 31.

Figure 20:
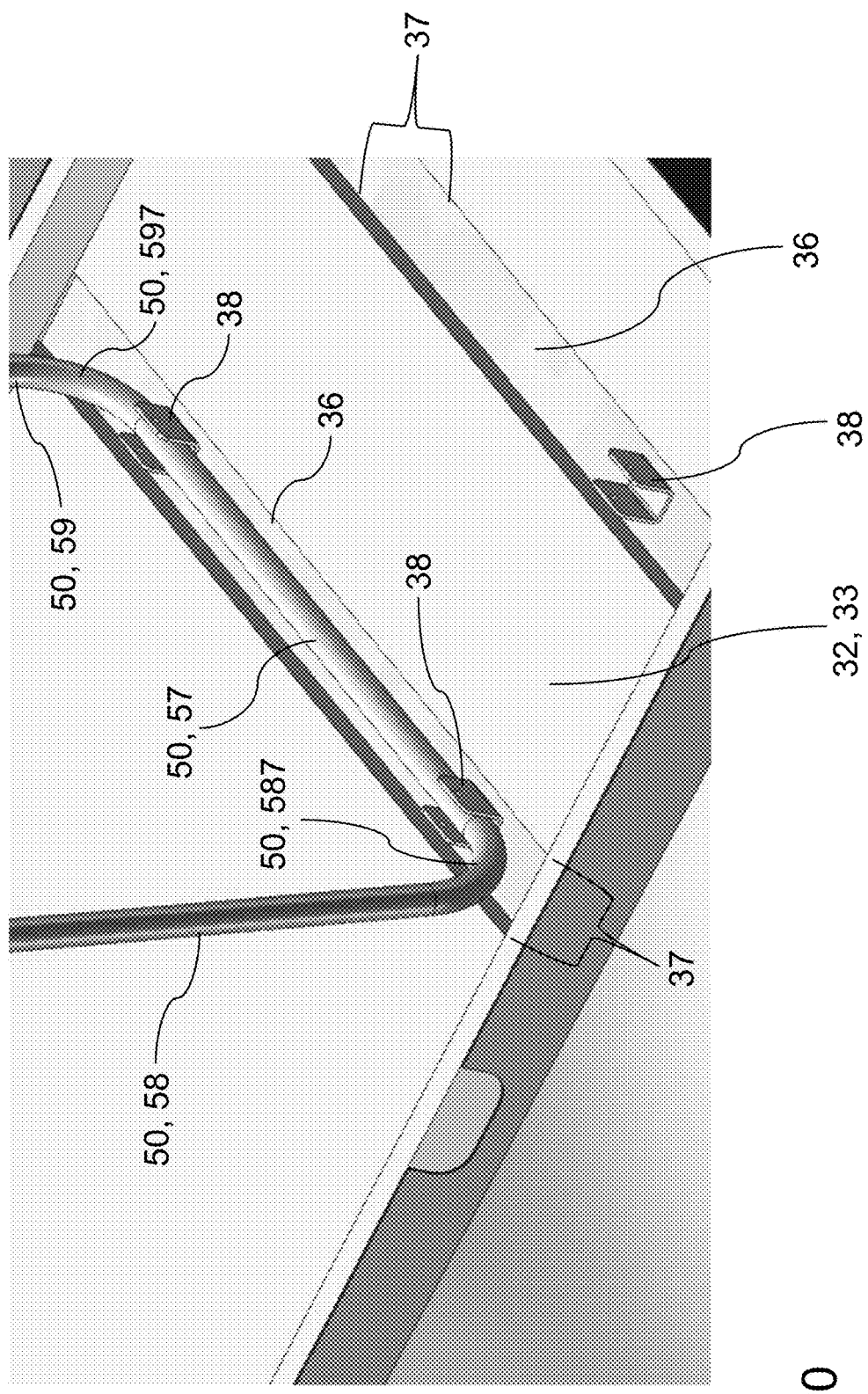
Figure 22:
Figure 23:
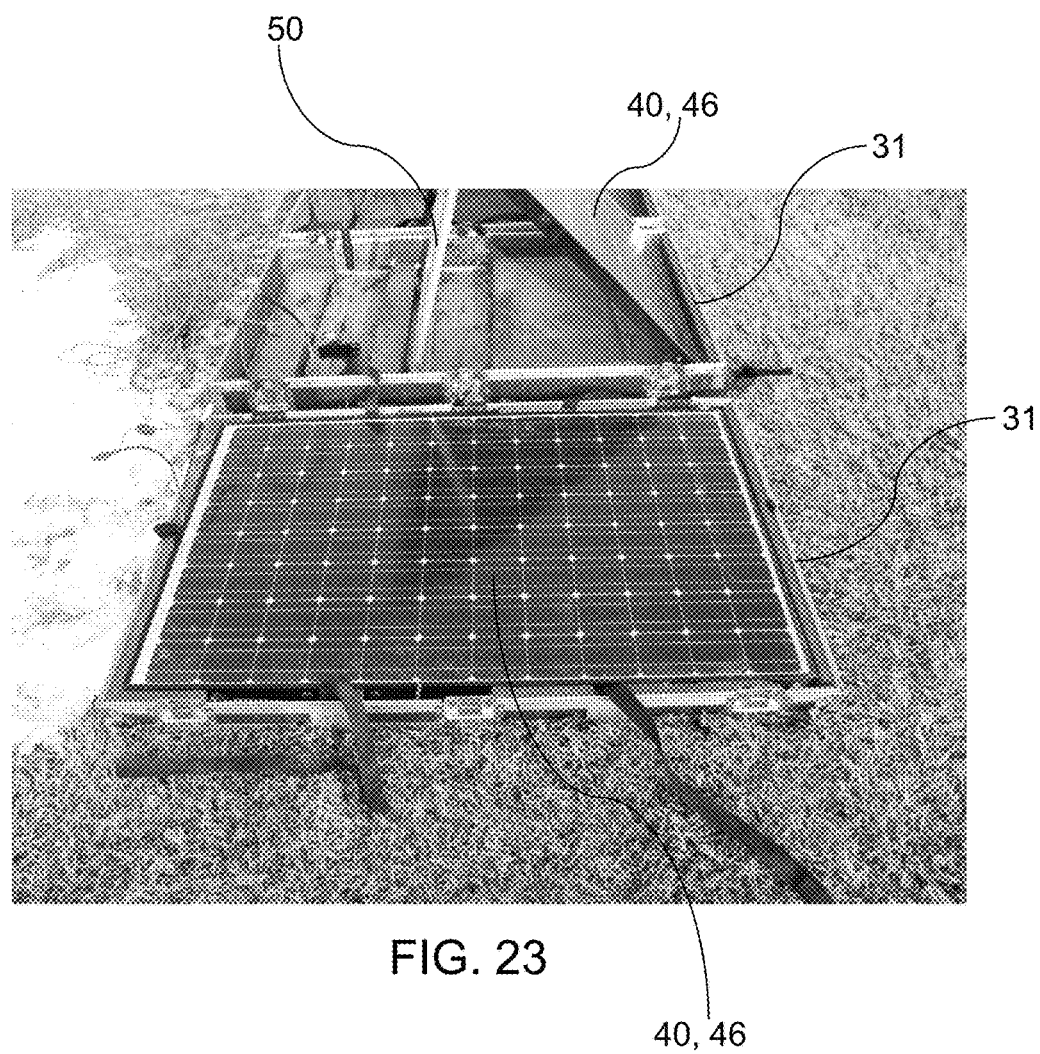

Particularly with reference to FIGS. 20-22, the U-shaped bar 50 has two straight U-side sections 58 and 59, two curved U-corner sections 587 and 597, and a straight U-bottom section 57 forming the U-shape. U-shaped bar 50 lies in a single geometric plane. Curved U-corner section 587 describes a right angle and is between straight U-side section 58 and straight U-bottom section 57. Curved U-corner section 597 describes a right angle and is between straight U-side section 59 and straight U-bottom section 57. Each of U-side sections 58 and 59 is perpendicular to U-bottom section 57. U-corner section 587 connects U-bottom section 57 with U-side section 58. U-corner section 597 connects U-bottom section 57 with U-side section 59. The U-shaped bar 50 props up the solar panel 40 with its U-bottom section 57 sitting in any one of plural slots 37 provided in the bottom surface 33 of the open case component 31, each slot 37 being described by a groove 36, the pair of brackets 38 situate therein, and the pair of locking pins 39 respectively engaging the brackets 38. The rotated/pivoted solar panel 40 is propped up and locked into place using the U-shaped bar 50, which is hingedly attached (via the bar-pivoting mechanism 59) to the solar panel 40. The U-bottom section 57 of the U-shaped bar 50 is slotted and locked (such as by use of locking pins 39, e.g., each pin associated with bracket 38) in the slot 37 defined by plural (e.g., two) aligned brackets 38 (in conjunction with their associated locking pins 39).

Disposition of the U-shaped bar 50 in different slots 37 creates discreet angles of deployment for optimized use in accordance with time and place, e.g., at various geographical regions/locations in the world and at different times of year. The present invention thus affords variability of the angle of inclination of the solar panel 40. This inventive capability is an important design feature for solar collection because, generally speaking, the orientation of a solar panel can affect performance by as much as eighty percent or so, depending on location and time of year.

The present invention's solar module deployment methodology can be applied to a variety of solar modules, including practically all rigid silicon panels. For instance, the present inventors investigated BP380 solar panels and Sanyo 205 solar panels and found them suitable for inventive practice. Inventive deployment is typically part of an entire solar system that includes conventional power components such as a power manager, a battery bank, and DC and/or AC output. The integration of these types of conventional power components in solar collection context is known in the art, and the inventive practitioner will appreciate how inventive solar collection apparatus can be associated with these conventional power components.

Inventive practice lends itself to alternative embodiments. For instance, the sizes and/or orientations of the present invention's case deployment can be changed/altered to meet different panel sizes and/or different deployment angles. As another example, the present invention's "U-Bar" deployment can be modified to have a sectioned base that allows the center section 57 of the U-bar 50 to be removed, essentially propping the panel up with the base poles (analogues of U-bar 50's side sections 58 and 59) locking into parallel tracks, thereby increasing the variability of the deployment angle—e.g., from discrete variability to continuous or more continuous variability.

Figure 2:
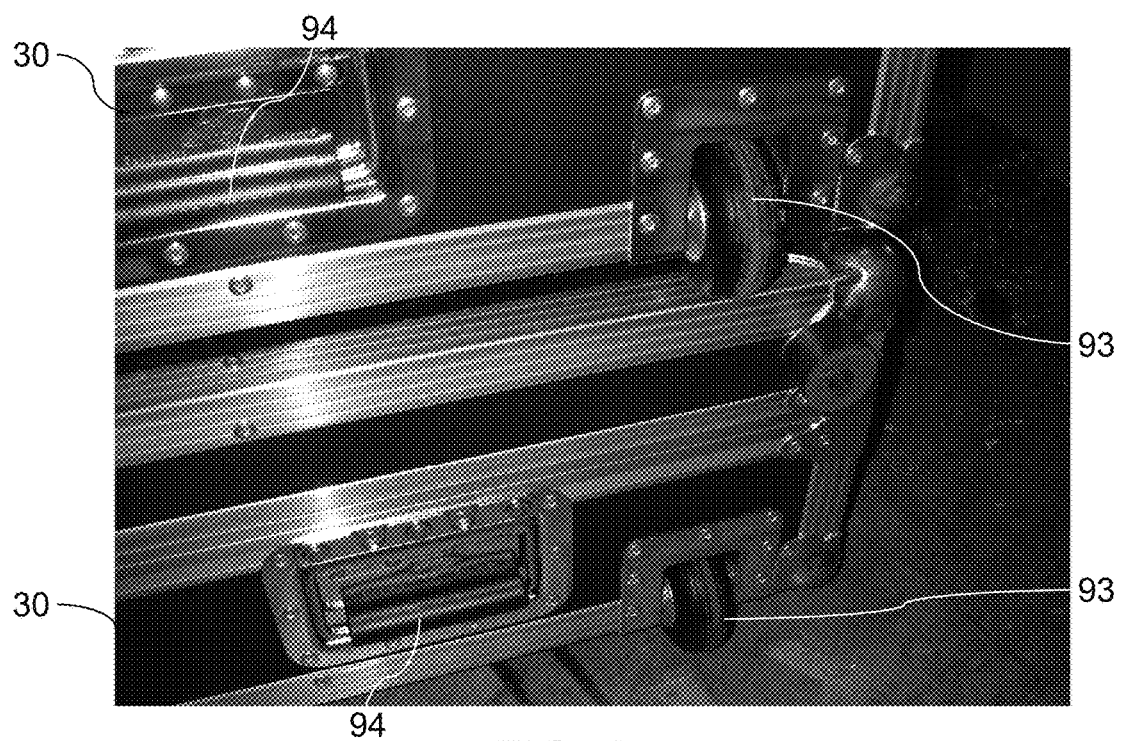
Figure 5:
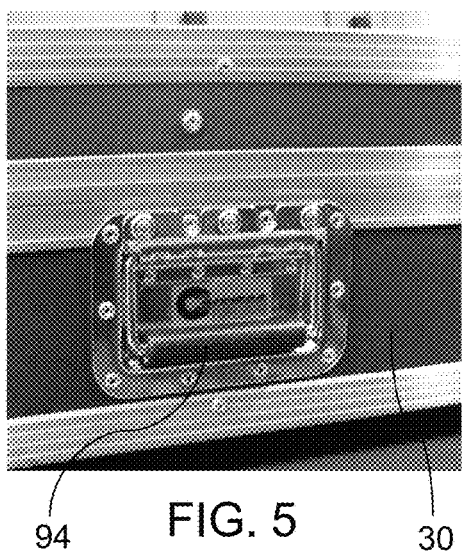

The present invention's solar panel deployment methodology uniquely incorporates shipping and packaging into function. Inventive practice provides for faster and easier deployment of panels and more safe (especially, panel-safe) and reliable ways of operating panels. The inventive system represents a more reliable overall system in transport and use of solar panels. Wheels 93 such as shown in FIG. 2 can be built into the case 30, e.g., one of the open case components 31. Handles 94 such as shown in FIGS. 2 and 5 can also be attached to the case 30 or to either open case component 31. The inventive device is typically lightweight and durable. Yet, the weight of the open case component 31 can help to anchor the solar panel 40 and to protect it against high wind loads. The inventive integration of the shipping container with functional elements decreases setup time, reduces weight, and facilitates deployment.

Since the inventive design integrates casing with operation, the shipping container will not be lost or discarded by deployment personnel, a problem often seen with equipment packaging in the field and commonly leading to system failures. Moreover, inventive practice represents a mobile, rapidly deployable solar system that can be designed to fall into high power ranges, e.g., 100 W-3 kW, which provides sufficient power to run most military equipment. Furthermore, typical embodiments of the present invention minimize moving parts and are otherwise less susceptible to seizing under extreme environmental conditions.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications, and changes to the principles disclosed herein may be made by one skilled in the art without departing from the true scope and spirit of the present invention, which is indicated by the following claims.

What is claimed is:

1. A solar collection system comprising a solar collection unit, said solar collection unit including two solar collection components and at least one fastener for attachment and detachment of said solar collection components with respect to each other, said solar collection components being attachable to each other and being detachable from each other to permit separate and apart respective situations of said solar collection components, each said solar collection component including:

- a half-case, said half-case describing approximately a rectangular parallelepiped and including a planar rectangular half-case bottom and a peripheral half-case wall perpendicular to and extending around the periphery of said half-case bottom, said half-case having a rectangular opening opposite said half-case bottom, said half-case bottom being characterized by plural parallel slots, said half-case wall including four rectangular half-case sides, said four half-case sides together forming a rectangular edge defining said rectangular opening;
- a solar panel, said solar panel including a planar rectangular solar panel face and two opposite solar panel sides perpendicular to said solar panel face and parallel to each other, said solar panel face having a solar collection surface;
- a pair of first hinge mechanisms, said first hinge mechanisms pivotably connecting said solar panel to said half-case, each said first hinge mechanism connecting a said half-case side and a said solar panel side, wherein said solar panel is positionable at a selected inclination with respect to said half-case bottom;
- a pair of reinforcement plates, each said reinforcement plate associated with a said solar panel side so as to reinforce said joining of a said half-case side and a said solar panel side;
- a U-bar, said U-bar lying in a single geometric plane and including a straight U-bottom section, two curved U-corner sections, and two straight parallel U-side sections, each said U-corner section coupling said U-bottom section with one said U-side section, each said U-side section being perpendicular to said U-bottom section;
- a pair of second hinge mechanisms, said second hinge mechanisms being distanced from said first hinge mechanisms and pivotably connecting said U-bar to said solar panel, each said second hinge mechanism connecting a said solar panel side and a said U-side section, wherein said U-bar is positionable at a selected U-bar angle with respect to said solar panel whereby said U-bottom section sits in a said slot;
- at least one locking mechanism affixed to said half-case bottom, said at least one locking mechanism being capable of locking and unlocking, with respect to said half-case bottom, a said U-bottom section that sits in a said slot, said U-bar thus being engageable and disengagable with respect to said half-case bottom;

wherein each said solar collection component is situatable whereby: said half-case bottom lies approximately horizontal upon a foundation; said peripheral half-case wall is approximately vertical above said foundation; said solar panel is positioned at a selected inclination with respect to said half-case bottom, for collecting solar energy; said solar panel is locked in place by said locking mechanism at said inclination;

wherein, in each said solar collection component, said solar panel is positionable and locked in place at said inclination whereby: said solar panel is pivoted so as to be a selected distance from said half-case bottom; said U-bar is pivoted so as to be a selected distance from said solar panel face; said U-bar is engaged in a said slot; said U-bar is locked in place in said slot;

wherein, when said solar collection components are attached, said solar collection unit is configured whereby: said half-cases are joined via said at least one fastener to form a unitary case; the respective said rectangular edges of said half-cases are congruous and adjoin each other; said unitary case and each said half-case are characterized by the same length and width; each said solar panel is positioned at a zero said inclination with respect to the corresponding said half-case bottom; each said U-bar is parallel to, and interposed between, the corresponding said solar panel face and the corresponding said half-case bottom; each said solar panel side is parallel to, and interposed between, the corresponding said half-case side and the corresponding said U-side section; said peripheral half-case wall of each said half-case surrounds the corresponding said solar panel and the corresponding said U-bar; the respective said pairs of said first hinge mechanisms of said solar collection components are vertically aligned; the respective said pairs of said second hinge mechanisms of said solar collection components are vertically aligned; the respective said half-case bottoms of said solar collection components, the respective said solar panel faces of said solar collection components, and the respective said U-bars of said solar collection components, are parallel to each other.

2. An apparatus for collecting solar energy, the apparatus comprising:

- a pair of substantially rectangular prismatic containers each having an inside container surface and an outside container surface, each said container having a container length, a container width, and a container height, each said container including a flat section and a perimeter wall approximately perpendicular to said flat section, said flat section having on opposite sides a grooved portion of said inside container surface and a flat portion of said outside container surface, said grooved portion provided with plural parallel grooves; said perimeter wall forming an extreme rectangular edge, the respective extreme rectangular edges of said containers describing congruent rectangular shapes, the respective container lengths of said containers being equal, the respective container widths of said containers being equal;
- at least one fastener for attachment and detachment of said containers with respect to each other;
- at least two pairs of aligned locking brackets mounted on said grooved portion of said inside container surface, each said pair of aligned locking brackets being associated with a said groove of said grooved portion;
- a pair of solar modules each pivotably connected to a said container, each said solar module being capable of a pivot-down module position or plural pivot-up module positions, said pivot-down module position being next to the corresponding said grooved portion of said inside container surface, each said pivot-up module position being distanced from the corresponding said grooved portion of said inside container surface, wherein said perimeter wall encompasses said solar module when said solar module is in said pivot-down module position; and
- a pair of U-shaped support members each pivotably connected to a said solar module, each said U-shaped support member being capable of a pivot-down member position or plural pivot-up member positions, said pivot-down member position being next to the corresponding said solar module, each said pivot-up member position being distanced from the corresponding said solar module, each said U-shaped support member lying in a single geometric plane and including a straight transverse crossbar section, two curved corner sections, and two straight parallel arm sections, each said corner section linking said crossbar section with one said arm section, each said arm section being perpendicular to said crossbar section, wherein the pivotable connection of said U-shaped support member to the corresponding said container includes hinging of each said arm section to the same said solar module;

said containers being joinable to each other so as to enclose said solar modules in said pivot-down module position and said U-shaped support members in said pivot-down member position, wherein when said containers are joined said containers are fastened via said at least one fasteners and the respective extreme rectangular edges of said containers adjoin each other, the joined said containers describing a substantially rectangular prismatic shape;

said containers being separable from each other for independent and apart deployment of each said solar module according to which said flat portion of said outside container surface is placed upon an area and said perimeter wall is approximately perpendicular to said area, each said solar module being deployable in either said pivot-down module position or a said pivot-up module position, wherein according to deployment of said solar module in said pivot-down module position said U-shaped support member is in said pivot-down member position, and wherein according to deployment of said solar module in a said pivot-up module position said U-shaped support member is in a said pivot-up member position and is secured in a said groove by a said pair of said aligned locking brackets, wherein the securing of said U-shaped support member in a said groove includes fitting and locking of said crossbar section in a said pair of said locking brackets, wherein when said containers are separated said containers are not fastened via said at least one fasteners and the respective extreme rectangular edges of said containers do not adjoin each other.

3. The apparatus of claim 2, wherein:
said area is at least approximately horizontal;
according to deployment of said solar module in said pivot-down module position said solar module is at least approximately horizontal;
according to deployment of said solar module in said pivot-up module position said solar module is inclined.

4. The apparatus of claim 2 further comprising an energy-absorptive member for disposition between said solar modules when said containers are joined to each other.

5. A solar collection device comprising a substantially rectangular prismatic case, at least one fastener, two solar panels, two locking mechanisms, and two U-shaped bars, each said solar panel having a solar collection side and an opposite side, said case including two substantially rectangular prismatic compartments that are attachable to and detachable from each other via said at least one fastener, said case and each said compartment being characterized by the same length and width, each said compartment including a flat bottom portion and a side wall upwardly bounding said bottom portion, said side wall being characterized by an outer rectangular edge, said flat bottom portion having a flat bottom interior surface and plural slots in said flat bottom interior surface, each said solar panel being hinged to the corresponding said compartment so as to be rotatably adjustable relative to said flat bottom interior surface, each said U-shaped bar being hinged to the corresponding said solar panel so as to be rotatably adjustable relative to said opposite side of said solar panel, each said locking mechanism being associated with a said slot, each said U-shaped bar lying in a single geometric plane and including a straight U-bottom portion, two straight parallel U-side portions, and two curved U-corner sections, each said U-corner section connecting said U-bottom section with one said U-side section, each said U-side section being perpendicular to said U-bottom section, said U-bottom portion fitting in each said slot and being lockable by the associated said locking mechanism, said device being configurable in a unitary mode or a dichotomous mode;

said unitary mode being characterized in that said compartments are attached to each other to form said case enclosing said solar panels and said U-shaped bars, said at least one fastener being in a fastening setting, the respective outer rectangular edges of said side walls adjoining each other, each said U-shaped bar being disposed at an approximately zero bar angle with respect to said opposite side of the corresponding said solar panel, each said solar panel being disposed at an approximately zero panel angle with respect to said interior surface of the corresponding said hollow case component, the respective said solar collection sides being adjacent to each other;

said dichotomous mode being characterized in that said compartments are detached from each other, said at least one fastener being in a non-fastening setting, the respective outer rectangular edges of said side walls not adjoining each other, said compartments being separately situatable apart from each other whereby said bottom portion of the corresponding said compartment is resting on an area, each said solar panel being positionable at a level position and at least two different slanted positions, wherein according to said level position said U-shaped bar is disposed at an approximately zero said bar angle with respect to said opposite side of said solar panel and said solar panel is disposed at an approximately zero said panel angle with respect to said flat bottom interior surface of said compartment and said side wall of said compartment at least substantially surrounds said U-shaped bar and said solar panel, and wherein according to each said slanted position said U-shaped bar is disposed at an oblique said bar angle with respect to said opposite side of said solar panel, said U-bottom portion engages a said slot and is locked in place by said locking mechanism, and said solar panel is disposed at an oblique said panel angle with respect to said flat bottom interior surface of said compartment.

6. The solar collection device of claim 5 wherein each said compartment includes a foam lining that at least partially lines said interior surface.

7. The solar collection device of claim 5 further comprising a foam insert for being interposed between said solar collection sides when said device is configured in a unitary mode.

8. The solar collection device of claim 5 wherein said slots are parallel to each other, and wherein each said slot has associated therewith a unique value of said oblique bar angle and a unique value of said oblique panel angle.

9. The solar collection device of claim 5 wherein:
said unitary mode is suitable for storage and transport of the solar collection device;
said dichotomous mode is suitable for operation of the solar collection device;
parameters including said panel angle and the situation of the solar collection device are selectable in furtherance of optimization of collection of solar energy during operation of the solar collection device.

10. The solar collection device of claim 5 wherein:
said case generally describes geometrically a closed rectangular prism, said closed rectangular prism being closed at all six geometric faces;
each said compartment generally describes geometrically an open rectangular prism, said open rectangular prism being open on one geometric face;
each said compartment is characterized by a height of said side wall that is smaller than the height that characterizes said case;
each said solar panel is hinged to the corresponding said compartment at the longitudinal end of said compartment.

11. The solar collection system of claim 1, further comprising at least one handle, each said handle attached to a said half-case side.

12. The apparatus of claim 2, further comprising at least one handle, each said handle attached to the corresponding said perimeter wall of at least one said container.

13. The solar collection device of claim 5, further comprising at least one handle, each said handle attached to the corresponding said side wall of at least one said compartment.

* * * * *